(12) United States Patent
Si

(10) Patent No.: US 10,700,685 B1
(45) Date of Patent: Jun. 30, 2020

(54) HIGH-SPEED SIGNAL DRIVING DEVICE

(71) Applicant: Shanghai Zhaoxin Semiconductor Co., Ltd., Shanghai (CN)

(72) Inventor: Hongwei Si, Shanghai (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 16/656,992

(22) Filed: Oct. 18, 2019

(30) Foreign Application Priority Data

Jan. 17, 2019 (CN) .......................... 2019 1 0044600

(51) Int. Cl.
*H03K 19/017* (2006.01)
*G06F 13/42* (2006.01)

(52) U.S. Cl.
CPC ... *H03K 19/01742* (2013.01); *G06F 13/4291* (2013.01); *G06F 2213/0042* (2013.01)

(58) Field of Classification Search
None
See application file for complete search history.

(56) References Cited

U.S. PATENT DOCUMENTS

| | | | |
|---|---|---|---|
| 7,298,173 B1* | 11/2007 | Jiang | H03K 5/01 326/82 |
| 7,486,112 B2* | 2/2009 | Tanaka | H04L 25/0286 326/68 |
| 8,228,096 B2* | 7/2012 | Nishi | H04L 25/0286 326/83 |
| 9,871,539 B2* | 1/2018 | Wu | H04B 1/04 |

* cited by examiner

*Primary Examiner* — Minh D A
*Assistant Examiner* — James H Cho
(74) *Attorney, Agent, or Firm* — McClure, Qualey & Rodack, LLP

(57) ABSTRACT

A high-speed signal driving device includes an assist driver, a delay adjuster, and a plurality of drivers. The assist driver receives a control signal and is coupled to a first output node and a second output node to output a first current to the first output node or the second output node. The delay adjuster receives the control signal to generate a plurality of delay signals. Each of the delay signals has a different delay time corresponding to the control signal. One of the drivers receives the control signal, and other drivers correspondingly receive the plurality of delay signals. The plurality of drivers are coupled to the first output node and the second output node via a first output end and a second output end.

12 Claims, 7 Drawing Sheets

HIGH-SPEED SIGNAL DRIVING DEVICE

CROSS REFERENCE TO RELATED APPLICATIONS

This Application claims priority of China Patent Application No. 201910044600.0 filed on Jan. 17, 2019, the entirety of which is incorporated by reference herein.

BACKGROUND OF THE INVENTION

Field of the Invention

The present invention relates to a driving device, and especially to a high-speed driving device to improve transmission quality of signals between a host and a device.

Description of the Related Art

An USB peripheral device of the USB2.0 standard includes a high-speed signal driving circuit. The high-speed signal driving circuit of the USB2.0 port includes a front-stage driver and a back-stage driver.

In the USB2.0 standard, when the high-speed signal driving circuit transmits data to an external device connected by the USB peripheral device, it is required to maintain a fixed output voltage amplitude (or swing) such as 400 mV on an output node of the back-stage driver. The output voltage amplitude is determined by a load resistor of the external device, a load resistor of the host and the rated current of the back-stage driver. According to the USB2.0 standard, both the load resistor of the host and the load resistor of the device may be set to 45 ohms. Thus, in order to maintain the output voltage amplitude as 400 mV, the rated current Ispec of the high-speed driving circuit will be set to about 18 mA, such as 17.8 mA.

Obviously, the voltage amplitude at the output node of the back-stage driver cannot always maintain as the fixed output voltage such as 400 mV, but may be present as a voltage flipping from a high voltage level to a low voltage level or from the low voltage level to the high voltage level. Thus, in order to improve the performance for transmitting data from the high-speed signal driving circuit to the external device connected by the USB peripheral device, a device and a method for precisely controlling and adjusting a signal flipping speed are required.

BRIEF SUMMARY OF THE PRESENT INVENTION

In order to resolve the issue described above, the present invention discloses a new driving circuit that may adjust the delay time of a plurality of delayed signals generated in accordance with a signal by a delay adjuster, thereby achieving more precise control of signal rising and falling time. In addition, when the signal starts to flip, the driving circuit adds a fixed driving current to the signal transmission end to reduce rising and falling time of the signal.

An embodiment of the present invention discloses a driving device that includes an assist driver, a delay adjuster, and a plurality of drivers. The assist driver receives a control signal and is coupled to a first output node and a second output node to output a first current to the first output node and the second output node. The delay adjuster receives the control signal to generate a plurality of delay signals, wherein each of the delay signals respectively has a different delay time corresponding to the control signal. The plurality of drivers respectively receives the control signal and one of the delay signals, and are respectively coupled to the first output node and the second output node via a first output end and a second output end. When the control signal is at a first logic level, the plurality of drivers respectively output a second current to the first output node via the first output end in response to the delay time. When the control signal is at a second logic level, the plurality of drivers respectively output the second current to the second output node via the second output in response to the delay time.

DETAILED DESCRIPTION OF THE PRESENT INVENTION

The present invention can be more fully understood by reading the subsequent detailed description with references made to the accompanying figures.

It should be understood that the figures are not drawn to scale in accordance with standard practice in the industry. In fact, it is allowed to arbitrarily enlarge or reduce the size of devices for clear illustration.

Figure 1:
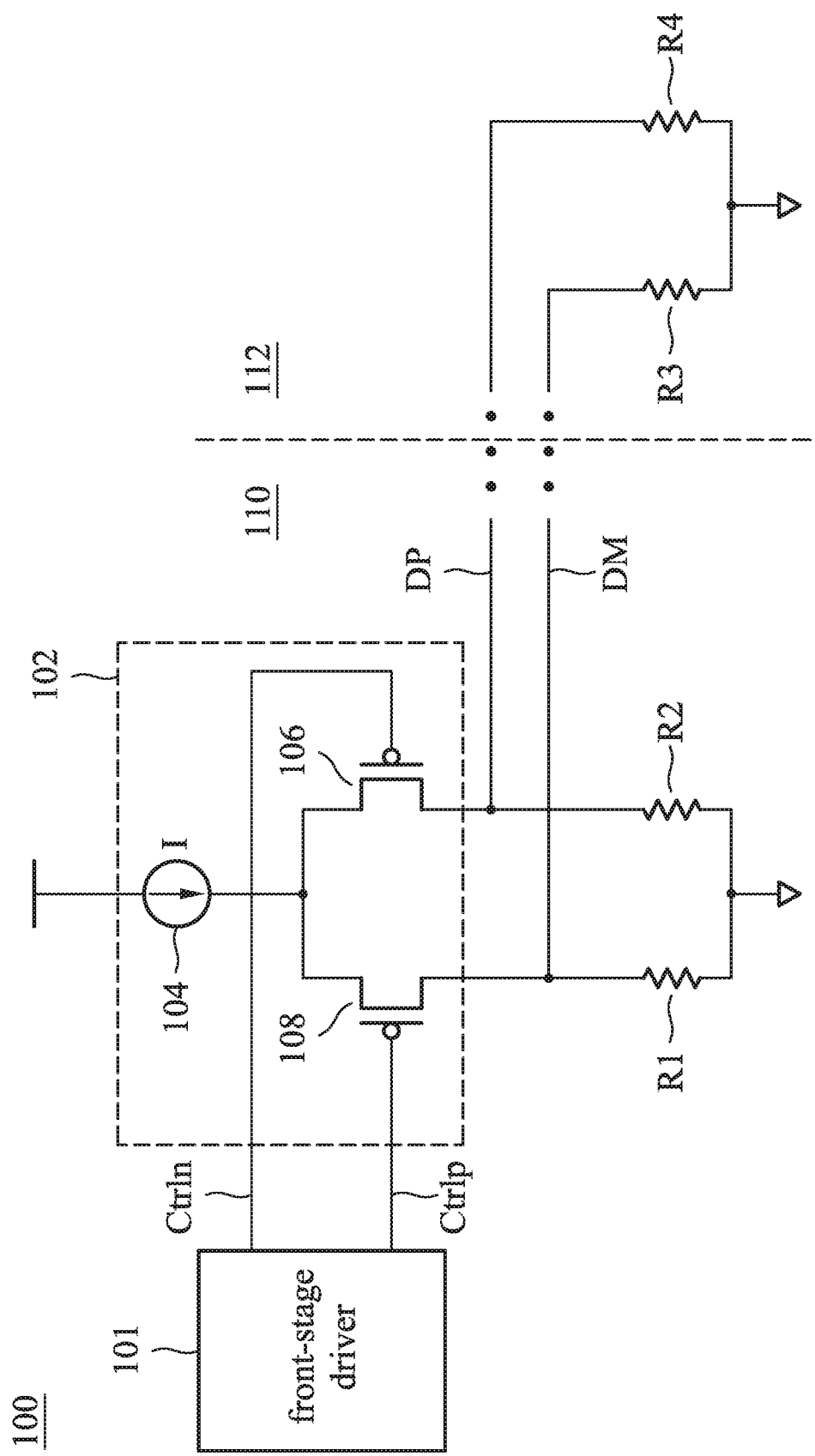
FIG. 1 is a schematic diagram of a driving device 100 in accordance with an embodiment of the disclosure.

The high-speed signal driving circuit of the USB2.0 port includes a front-stage driver and a back-stage driver. FIG. 1 is a schematic diagram of a driving device 100 in accordance with an embodiment of the disclosure. As shown in FIG. 1, the driving device 100 includes a front-stage driver 101, a back-stage driver 102, load resistors of a host 110, including a first resistor R1 and a second resistor R2, and load resistors of a device 112, including a third resistor R3 and a fourth resistor R4.

As shown in FIG. 1, the back-stage driver 102 via a pair of differential switches such as a p-type MOSFET 106 and a p-type MOSFET 108 respectively receives a pair of differential control signals Ctrin and Ctrlp output by the front-stage driver 101, to control the direction of the current from a current source 104, so as to accomplish the control of another pairs of differential signals flipping at a node DP and a node DM. Specifically, as shown in FIG. 1, when the signal Ctrin output to a gate of the p-type MOSFET 106 is at a logic low level, and the signal Ctrlp output to a gate of the p-type MOSFET 108 is at a logic high level, the p-type MOSFET 106 turns on and the p-type MOSFET 108 turns off, and thus one half of the current output from the current source 104 flows to the second resistor R2 connected to the node DP of the host 110, and the other half of the current flows to the fourth resistor R4 connected to the node DP of the device 112. At this moment, the voltage at the node DP rises up to the high voltage level, and the voltage at the node DM is pulled down to a ground voltage level. Similarly, when the signal Ctrlp output by the front-stage driver 101 is at the logic low level, the p-type MOSFET 108 turns on, the p-type MOSFET 106 turns off, the voltage at the node DM is at the high voltage level, and the voltage at the node DP is pulled down to the ground voltage level. Based on the description above, the front-stage driver 101 directly adjusts the time of signal flipping between the node DP and the node DM via controlling the slew rate of the gate voltage from the p-type MOSFETs 106 and 108 of the back-stage driver 102. The signal flipping between the node DP and the node DM means that the signal at the node DP changes from the low level to the high voltage level, meanwhile the signal at the node DM changes from the high level to the low voltage level, or the signal at the node DP changes from the high voltage level to the low level, meanwhile the signal at the node DM changes from the low level to the high level. The signal at the nodes DP and DM is a voltage signal or a current signal. According to an embodiment of the present invention, the current output by the current source 104 is equal to the rated current Ispec of the driving device 100. According to some embodiments of the present invention, the high level and the low level are opposite to each other.

But the structure described above has 2 drawbacks: (1) the front-stage driver 101 outputs the differential signals Ctrln and Ctrlp to the p-type MOSFETs 106 and 108, to indirectly control the signal flipping at the nodes DP and DM by adjusting the voltages of the control signals on the gates of p-type MOSFETs 106 and 108, that is by controlling the slew rate of the gate voltage. However, the above operations cannot meet the increasingly precise adjustment requirement. (2) If a larger capacitance load is present at the nodes DP and DM, due to the limitation of the RC time-constant effect of a capacitor and a resistor, it is difficult to perform an adjustment for the voltage rising and falling time at the nodes DP and DM by adjusting the slew rate of the gate voltage. Even if the slew rate of the gate voltage is raised, the margin of rising and falling time for the voltage at the nodes DP and DM is squeezed because of the limitation of the RC time-constant effect, so that the rising and falling time cannot be further decreased which affects the signal transmission quality.

Figure 2:
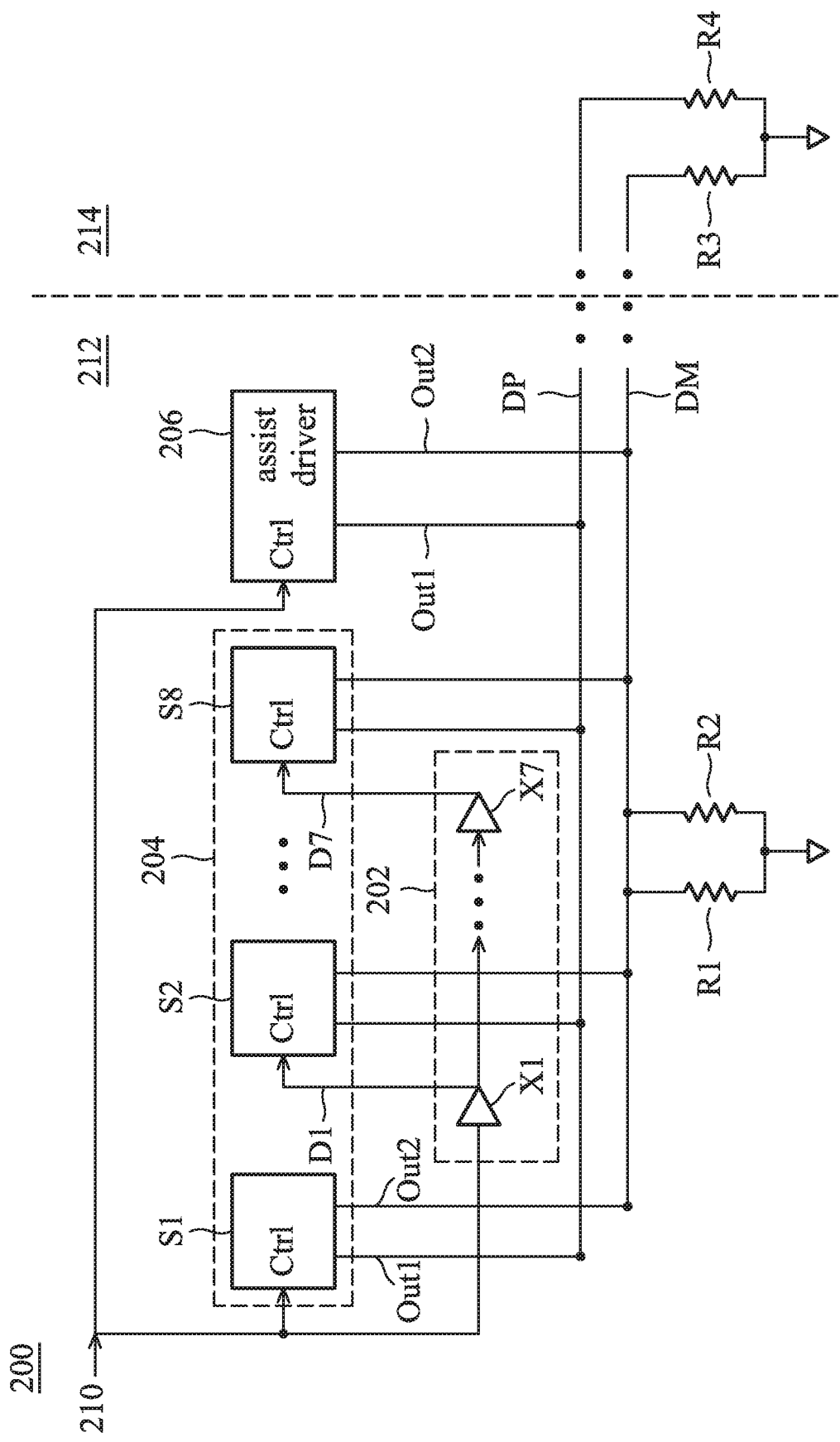
FIG. 2 is a schematic diagram of a driving device circuit 200 in accordance with the embodiment of the disclosure.

FIG. 2 is a schematic diagram of a driving device circuit 200 in accordance with the embodiment of the disclosure. As shown in FIG. 2, the driving device 200 includes a delay adjuster 202, a driving portion 204 including at least a plurality of drivers S1~S8, an assist driver 206, load resistors of a host 212 including a first resistor R1 and a second resistor R2, and load resistors of a device 214 including a third resistor R3 and a fourth resistor R4. The delay adjuster 202 receives a control signal 210 from the front-stage driver to generate a plurality of delay signals D1~D7, wherein the control signal 210 is one of a pair of differential signals from the front-stage driver, and corresponding to the control signal 210 each of the delay signals D1~D7 has a different delay time. The driving portion 204 is coupled to the first output node DP and the second output node DM. As shown in FIG. 2, each of the drivers S1~S8 of the driving portion 204 includes an input end and two output ends. For example, the driver S1 includes an input control end Ctrl, a first output end Out1, and a second output end Out2, wherein the input control end Ctrl is coupled to the control signal 210, the first output end Out1 and the second output end Out2 are respectively coupled to the first output node DP and the second output node DM. The input control end Ctrl of each of the drivers S1~S8 receives the control signal 210 and the plurality of delay signals D1~D7. Specifically, the input control end Ctrl of the driver S1 receives the control signal 210, the respective control end Ctrl of the drivers S2~S8 receive the delay signals D1~D7 one-by-one. For example, the input control end Ctrl of driver S2 receives delay signal D1, the input control end Ctrl of driver S3 receives delay signal D2, and the input control end Ctrl of driver S8 receives delay signal D7. Moreover, when the control signal 210 is at a first logic level, such as at a high voltage level, each of the drivers S1~S8 outputs a current from the first output end Out1 to the first output node DP in sequence of S1 to S8 in response to the control signal 210 and the delay signals D1~D7. When the control signal 210 is at a second logic level, such as at a low voltage level, each of the drivers S1~S8 respectively outputs a current from the first output end Out1 to the second output node DM in sequence in response to the control signal 210 and the delay signals D1~D7.

In a present embodiment, the driving portion 204 includes eight single drivers S1~S8, and the delay adjuster 202 includes seven delayers X1~X7 that are coupled to each other in sequence. Using TD to represent the delay time of one of the delayers X1~X7. If N*TD represents the sum of the delay time of the first N delayers, corresponding to the delayers X1~X7, N can be a positive integral 1-7, the delay signals D1~D7 respectively have 1*TD~7*TD delay time corresponding to the control signal 210. In sequence, the drivers S1~S8 are respectively turned on under the driving of the control signal 210 and the delay signals D1~D7. Each of the drivers S1~S8 outputs a current to the second resistor R2 and the fourth resistor R4 in sequence, so that the voltage at the first output node DP gradually increases from a low voltage level to a high voltage level, or each of the drivers S1~S8 outputs a current to the first resistor R1 and the third resistor R3 in sequence, so that the voltage at the second output node DM gradually increases from a low voltage level to a high voltage level. Until the eight drivers S1~S8 are all turned on, the current that flows through the first output node DP or the second output node DM is equal to the rated current Ispec of the driving device. During the process that the current at the first output node DP or the second output node DM is accumulated from zero or a fixed current value to the rated current Ispec, the drivers S1~S8 are turned on in sequence for working effectively. The process takes a time of about 7*TD, which is the time it takes for a signal of either of the nodes DP or DM for rising from the low voltage level to the high voltage level or for falling from the high voltage level to the low voltage level. In the present embodiment, the driving portion 204 includes the drivers S1~S8, the current respectively may output from each of the drivers S1~S8 is configured to be equal to one-eighth of the rated current Ispec of the driving device. During the process that the eight drivers S1~S8 are successively turned on in sequence, the voltage of an output signal sent to the first output node DP or the second output node DM gradually increases from the low voltage level. When the eight drivers S1~S8 are all turned on, the process takes a time of 7*TD, meanwhile the voltage of the output signal reaches a maximum value. Therefore, a precise controlling of the rising or falling time of the output signal from the first output node DP/the second output node DM may be done by adjusting the delay time TD of the delayers X1~X7 or by adjusting the delay time 1*TD-7*TD that the delay signals D1-D7 corresponding to the control signal 210. In this embodiment, the delay time TDs of each of the delayers X1-X7 are similar. In other embodiments, the delay time TD of each of the delayers X1~X7 may be similar, different, or partially similar. In other embodiments, the current respectively output from the drivers S1~S8 may be different or be partially similar, as long as the sum of the current of each of the drivers is equal to the rated current Ispec of the driving device. It should be noted that the number of drivers and the delay adjusters is merely illustrative and is not a limitation of the present invention.

As shown in FIG. 2, the driving device 200 further includes an assist driver 206. The assist driver 206 includes a first output end Out1, a second output end Out2, and a control node Ctrl. The first output end Out1 and the second output end Out2 are respectively coupled to the first output node DP and the second output node DM. When the logic level of the control signal 210 is changed (for example, it may be changed from a logic high level to a logic low level, or changed from the logic low level to the logic high level), the control node Ctrl of the assist driver 206 directly receives the control signal 210, and pre-generates a current with the value of one-eighth of the rated current Ispec of the driving device at the first output end Out1 or the second output end Out2. The current is sent to the first output node DP and the second output node DM to appropriately speed up the output signals' flipping at the first output node DP and the second output node DM. The operation described above provides a partial current, such as one-eight of the Ispec, to the first output node DP and the second output node DM in advance to speed up the output signal flipping, wherein the magnitude of the current may also be other value. This operation may resolve a problem that the load capacitance at the first output node DP or the second output node DM is too large, for example, the load capacitance is larger than 6 pF but smaller than 10 pF, so that the speed of the output signal flipping at the first output node DP or the second output node DM is slow. The detail will be described later.

Figure 3:
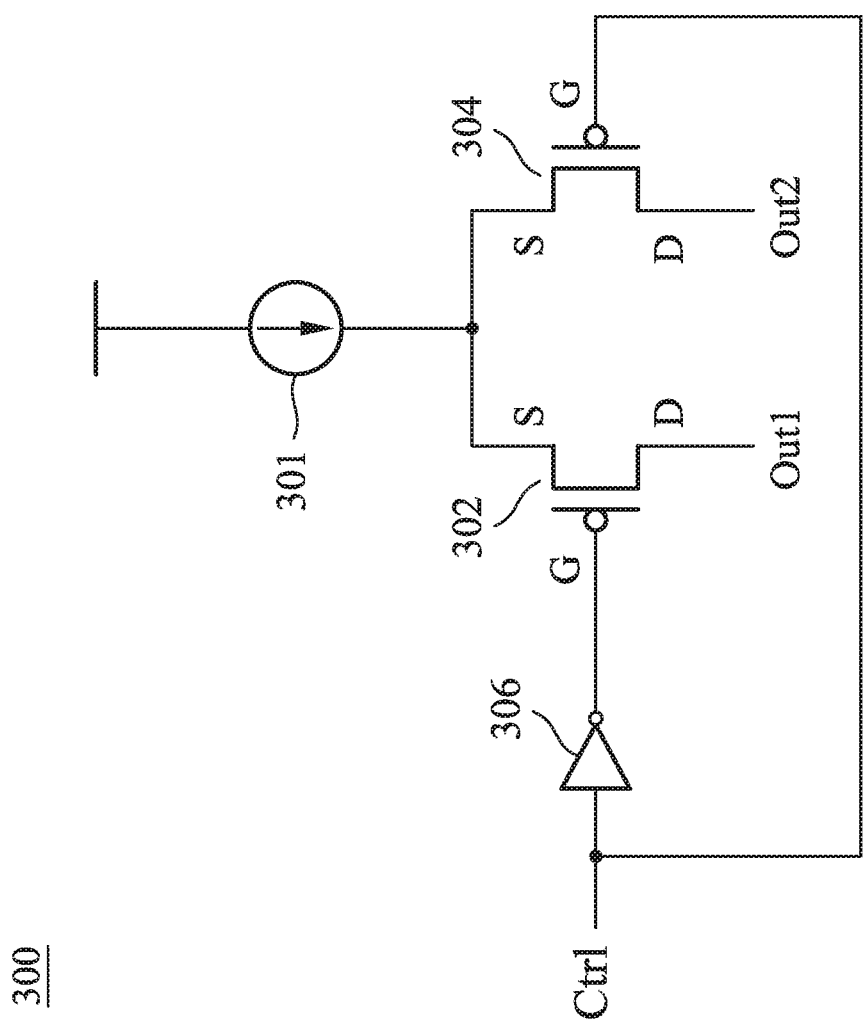
FIG. 3 is a schematic diagram of a driver 300 in FIG. 2 in accordance with the embodiment of the disclosure.

FIG. 3 is a schematic diagram of any of the drivers S1~S8 in FIG. 2 in accordance with the embodiment of the disclosure. As shown in FIG. 3, each of the drivers S1~S8 in FIG. 2 includes a current source 300, a first p-type MOSFET 302, a second p-type MOSFET 304, and an inverter 306. The source S of the first p-type MOSFET 302 is coupled to the source S of the second p-type MOSFET 304, and the source S of the first p-type MOSFET 302 and the source S of the second p-type MOSFET 304 are commonly coupled to the current source 300. The drain D of the first p-type MOSFET 302 serves as the first output end Out1, and the drain D of the second p-type MOSFET 304 serves as the second output end Out2. The input end of the inverter 306 is coupled to the gate G of the second p-type MOSFET 304, and the output end of the inverter 306 is coupled to the gate G of the first p-type MOSFET 302, wherein the input end of the inverter 306 of each of the drivers 202 serves as the control node Crtl of each of the drivers S1~S8. As described above, a current respectively output from each of the drivers S1~S8 may be similar, different, or partially similar, as long as the sum of the current of each of the drivers is equal to the rated current Ispec of the driving device. Thus, the currents output by each current source 300 of each of the drivers may be similar, different, or partially similar, as long as the sum of the current output by the current source 300 of each of the drivers is equal to the rated current Ispec of the driving device.

Figure 4:
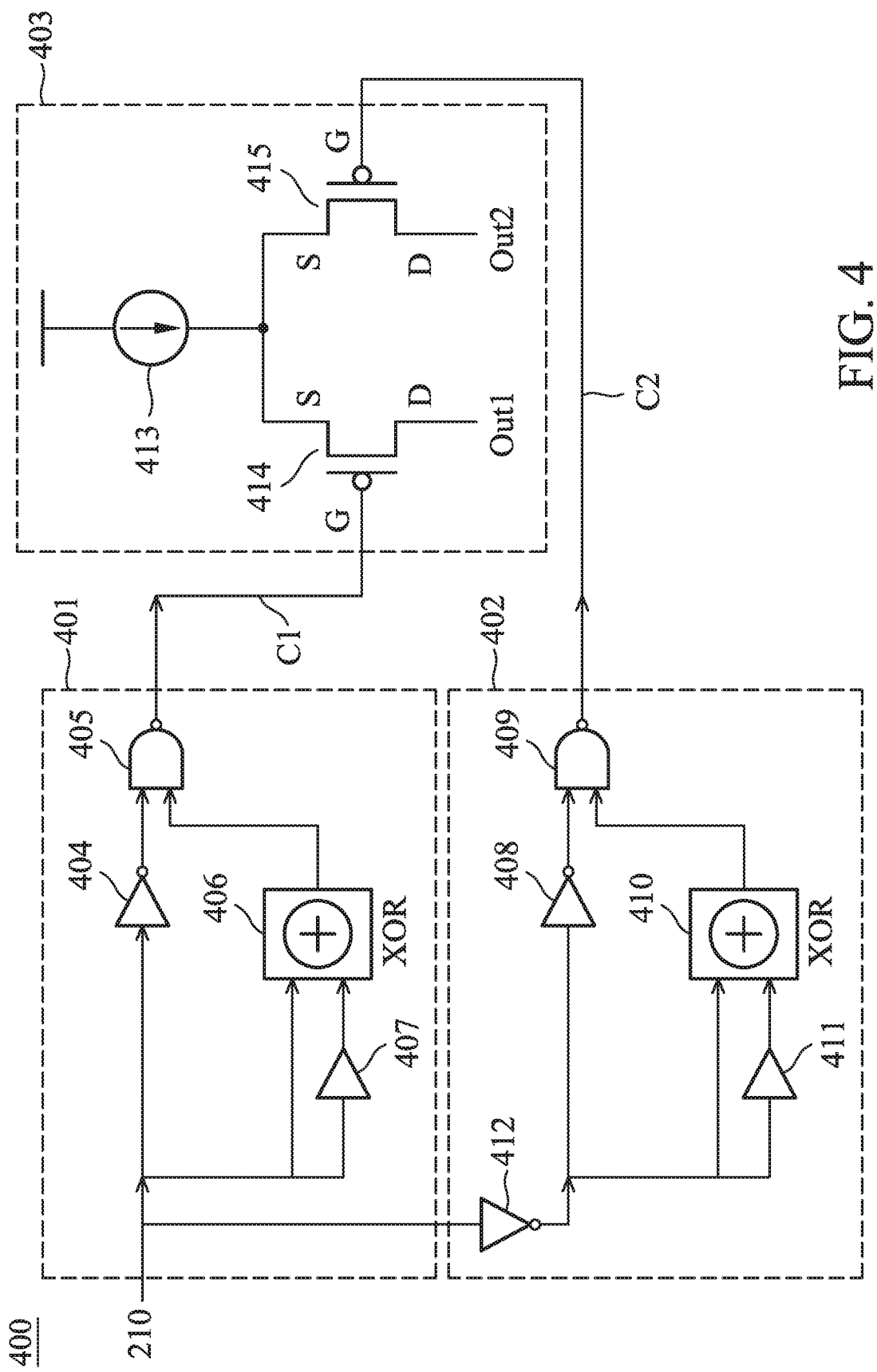
FIG. 4 is a schematic diagram of an assist driver 400 in FIG. 2 in accordance with the embodiment of the disclosure.

FIG. 4 is a schematic diagram of an assist driver 206 in FIG. 2 in accordance with the embodiment of the disclosure. As shown in FIG. 4, the assist driver 206 includes a first control module 401, a second control module 402, and an assist module 403. The first control module 401 receives the control signal 210 and sends a first control signal C1 to the assist module 403, the second control module 402 receives the control signal 210 and sends a second control signal C2 to the assist module 403, and the assist module 403 receives the first control signal C1 and the second control signal C2 and outputs a current from the first output end Out1 or the second output end Out2.

As shown in FIG. 4, the first control module 401 includes an inverter 404, a NAND gate 405, a delayer 407, and a XOR gate 406. The first input end of the XOR gate 406 is coupled to the input end of the delayer 407 and the input end of the inverter 404 to receive the control signal 210. The output end of the delayer 407 is coupled to the second input end of the XOR gate 406. The first input end of the NAND gate 405 is coupled to the output end of the inverter 404. The second input end of the NAND gate 405 is coupled to the output end of the XOR gate 406. The output end of the NAND gate 405 serves as the output end of the first control module 401 to send a first control signal C1 to the assist module 403. According to an embodiment of the present invention, the delay time of the delayer 407 may be set to be but not limited in 1 ns.

As shown in FIG. 4, the second control module 402 includes an inverter 408, a NAND gate 409, a delayer 411, a XOR gate 410, and the other inverter 412. The input end of the inverter 412 is coupled to the control signal 210. The output end of the inverter 412 is coupled to the input end of the delayer 411 and the input end of the inverter 408. The first input end of the XOR gate 410 is coupled to the input end of the delayer 411 and the input end of the inverter 408, to receive the output signal from the inverter 412. The output end of the delayer 411 is coupled to the second input end of the XOR gate 410. The first input end of the NAND gate 409 is coupled to the output end of the inverter 408. The second input end of the NAND gate 409 is coupled to the output end of the XOR gate 410. The output end of the NAND gate 409 serves as the output end of the second control module 402 to send a second control signal C2 to the assist module 403. According to an embodiment of the present invention, corresponding to the delayer 407 described above, the delay time of the delayer 411 may also be set to be but not limited in 1 ns.

As shown in FIG. 4, the assist module 403 includes a current source 413, a third p-type MOSFET 414, and a fourth p-type MOSFET 415. One end of the current source 413 is coupled to an operation voltage, the other end of the current source 413 is coupled to the source S of the third p-type MOSFET 414 and the source S of the fourth p-type MOSFET 415. The gate G of the third p-type MOSFET 414 is coupled to the first control signal C1 from the first control module 401, and the drain D of the third p-type MOSFET 414 serves as the first output end Out1 of the assist module 403. The gate of the fourth p-type MOSFET 415 is coupled to the second control signal C2 from the second control module 402, and the drain D of the fourth p-type MOSFET 415 serves as the second output end Out2 of the assist module 403.

When the control signal 210 is changed from a logic low level, such as logic L, to a logic high level, such as logic H, the first control signal C1 from the first control module 401 is logic high level, so that the third p-type MOSFET 414 in the assist module 403 is turned off. Specifically, in the first control module 401, the first input end of the XOR gate 406 receives the control signal 210 which currently is in logic high level state, the second input end of the XOR gate 406 receives the control signal 210 which currently is in logic low level state, i.e. the control signal 210 before 1 ns, thus the output of the XOR gate 406 is logic high level, and due to the logic low level output by the inverter 404, the control signal C1 sent by the NAND gate 405 to the assist module 403 is logic high level, at this moment, the third p-type MOSFET 414 in the assist module 403 is turned off. When the control signal 210 is changed from a logic low level, such as logic L, to a logic high level, such as logic H, the second control signal C2 from the second control module 402 is logic low level, so that the fourth p-type MOSFET 415 in the assist module 403 is turned on. Specifically, in the second control module 402, the first input end of the XOR gate 410 receives the inverted signal of the control signal 210 of the current logic high level state, the second input end of the XOR gate 410 receives the inverted signal of the control signal 210 of the logic low level state, i.e. the inverted signal of the control signal 210 before 1 ns, thus the output of the XOR gate 410 is logic high level, and due to the logic high level output by the inverter 408, the control signal C2 sent by the NAND gate 409 to the assist module 403 is logic low level, at this moment, the fourth p-type MOSFET 415 in the assist module 403 is turned on. Similarly, when the control signal 210 is changed from the logic high level to the logic low level, the first control signal C1 from the first control module 401 is logic low level, so that the third p-type MOSFET 414 in the assist module 403 is turned on, and the second control signal C2 from the second control module 402 is logic high level, so that the fourth p-type MOSFET 415 in the assist module 403 is turned off. When the control signal 210 is maintained at the logic high level or maintained at the logic low level, the first control signal C1 from the first control module 401 and the second control signal C2 from the second control module 402 are simultaneously maintained at the logic high level, the third p-type MOSFET 414 and the fourth p-type MOSFET 415 in the assist module 403 are simultaneously turned off.

When the assist module 403 receives the first control signal C1 of the logic high level and the second control signal C2 of the logic low level, output the current of the current source 413 via the second output end Out2 of the assist module 403. When the assist module 403 receives the first control signal C1 of the logic low level and the second control signal C2 of the logic high level, output the current of the current source 413 via the first output end Out1 of the assist module 403. When the assist module 403 receives the first control signal C1 of the logic high level and the second control signal C2 of the logic high level, no current is output by the assist module 403. The current of the current source 413 can be set to the average value of the currents generated in each of the drivers shown in FIG. 2. For example, according to an embodiment of the present invention in FIG. 2, the current of the current source 413 may be set to one-eighth of the rated current Ispec of the driving device.

Referring together to FIG. 2, when the control signal 210 is flipped, the assist driver 400 shown in FIG. 4 outputs a current prior to the drivers S2~S8, so that a maximum current accumulated at the first output node DP or the second output node DM is greater than one-eighth of the rated current Ispec of the driving device, the current output to the first output node DP or the second output node DM is pre-emphasized to further increase the amplitude of the output signal at the first output node DP or the second output node DM, so that the slope of the output signal rising and falling is turned steeper, to improve the transmission quality of the output signal. In other words, when the load capacitance at the first output node DP or the second output node DM is large, the rising and falling time of the output signal at the first output node DP or the second output node DM is further compressed by the assist driver 400 in FIG. 4 when the control signal 210 is flipped. When the control signal 210 ends up the flipping, the assist driver 400 does not output any current, and because the delay time of the delayer 407 in the first control module 401 is the same as the delay time of the delayer 411 in the second control module 402, wherein the delay time is set at a pre-determined value such as 1 ns, so that the assist driver 400 may be turned off before the output signal at the first output node DP or the second output node DM finishes a flipping action, to remove the influence on the amplitude of the output signal at the first output node DP or the second output node DM (de-emphasis) in time.

Flipping time of the output signal at the first output node DP or the second output node DM can be controlled as the sum of the delay time of each of the delayers X1~X7. For example, as shown in FIG. 2, when the delay time of each of the delayers X1-X7 is similar, and the delay time of each of the delayers X1-X7 is TD, then the flipping time of the output signal at the first output node DP or the second output node DM can be controlled as 7*TD. According to current technique, the flipping time of the output signal at the first output node DP or the second output node DM should be larger than 300 ps and be smaller than the delay time of the delayer 407 in the first control module 401 and smaller than the delay time of the delayer 411 in the second control module 402.

In another embodiment of the present disclosure, the output signal of the NAND gate in FIG. 4, such as a NAND gate 405, can be directly coupled to the input end of the inverter 306 in FIG. 3, and can also be coupled to one or more delayers or an even number of inverters first (not shown), after then, it may be coupled to the output end of the inverter 306 in FIG. 3. It can be freely adjusted in accordance with the required circuit application and a logic level that is the logic high level or the logic low level.

In another embodiment of the present disclosure, as shown in FIG. 3, the rising and falling time of the signal flipping may be adjusted by controlling the current output from each of the current sources 300.

Figure 5:
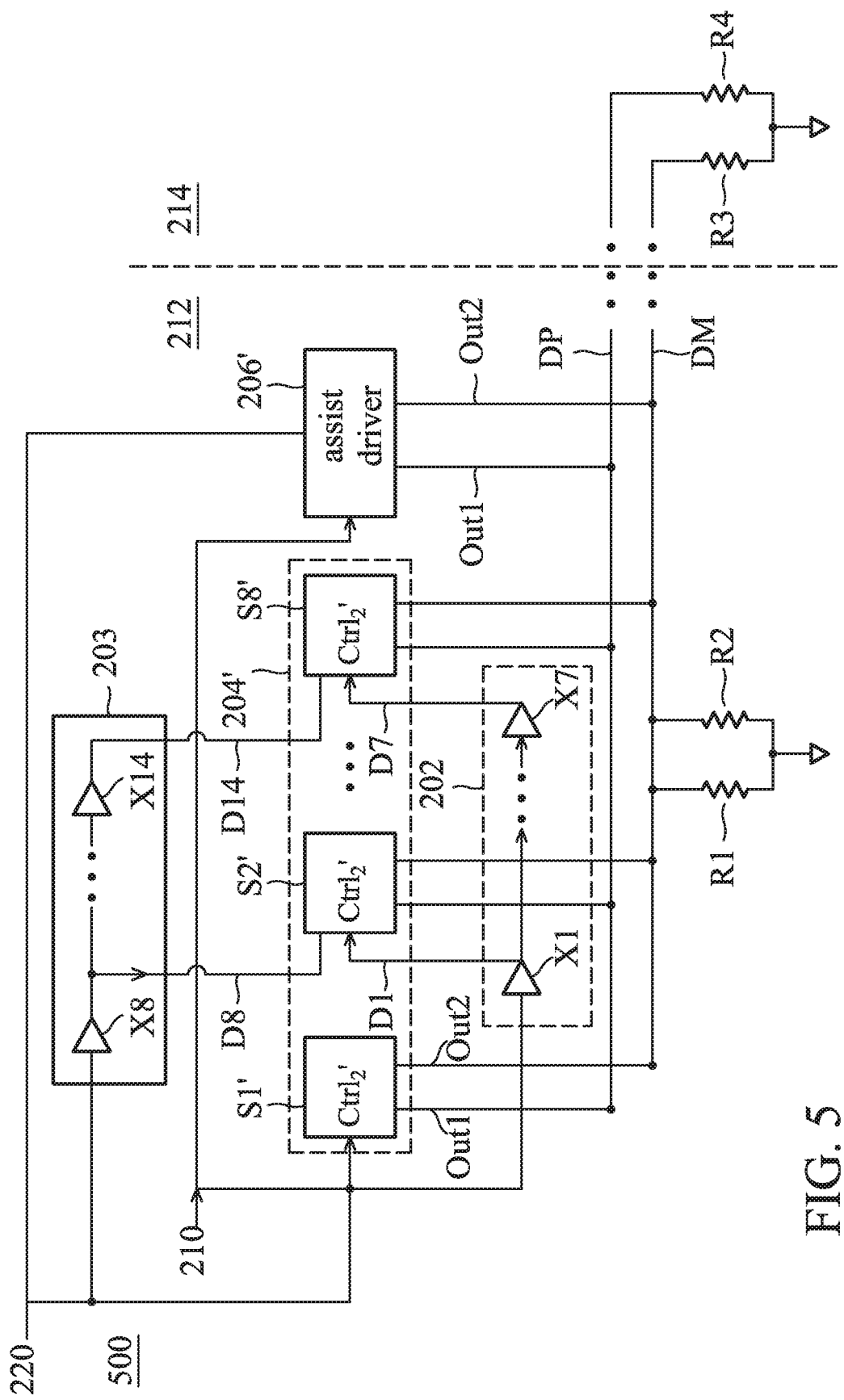
FIG. 5 is a block diagram of a driving device circuit 500 in accordance with another embodiment of the disclosure.

FIG. 5 is a block diagram of a driving device circuit 500 in accordance with another embodiment of the disclosure. As shown in FIG. 5, unlike the embodiment in FIG. 2, the driving circuit 500 receives a pair of differential control signals 210 and 220, so that it is necessary to add a delay adjuster 203. The delay adjuster 203 includes delayers X8~X14. The delay adjuster 203 has the same structure as the delay adjuster 202, so as to delay the control signal 220. The delay that the delay adjuster 203 applied on the control signal 210 is synchronized with the delay that the delay adjuster 202 applied on the control signal 210. Specifically, the delay adjuster 203 generates a plurality of delay signals D8~D14 corresponding to the delay signals D1~D7 in FIG. 2. Corresponding to each of the delay signals D1~D7 in FIG. 2 being respectively coupled to the first input end Ctrl1 of each of the drivers S2~S8, each of the delay signals D1~D7 in FIG. 5 is respectively coupled to the first input end Ctrl1' of each of the drivers S2'~S8', and the delay signals D8~D14 are respectively coupled to a second input control node Ctrl2' of each of the drivers S2'~S8' one-by-one. And the control signals 210 and 220 are directly coupled to an assist driver 206'. The specific content will be described with reference to FIG. 6 and FIG. 7.

Figure 6:
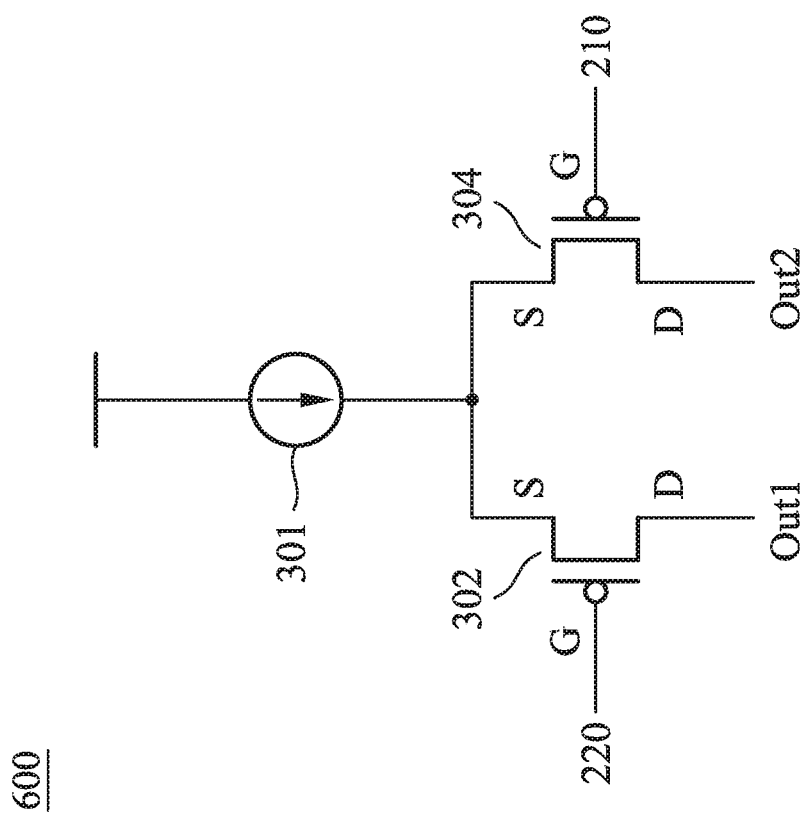
FIG. 6 is a schematic diagram of a driver 600 in FIG. 5 in accordance with the embodiment of the disclosure.

FIG. 6 is a schematic diagram of any of the drivers S1'~S8' in FIG. 5 in accordance with the embodiment of the disclosure. As shown in FIG. 6, the difference between each of the drivers S1'~S8' in FIG. 5 and each of the drivers S1~S8 in FIG. 3 is that a single driver in FIG. 5, such as driver S1', does not include the inverter 306 shown in FIG. 3, thus the gate of the first p-type MOSFET 302 directly serves as the second input control node Ctrl2' to receive the control signal 220.

Figure 7:
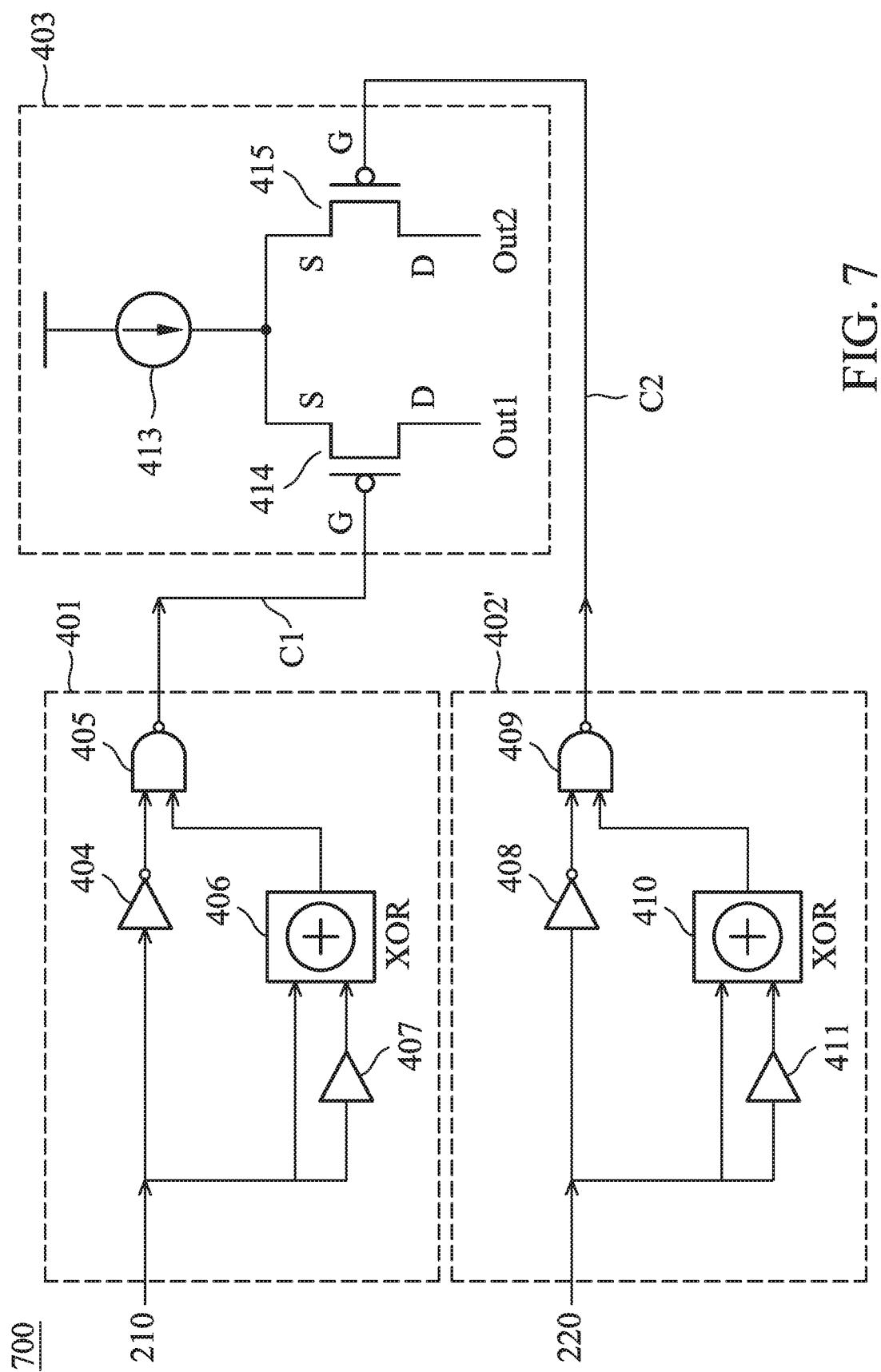
FIG. 7 is a schematic diagram of an assist driver 700 in FIG. 5 in accordance with the embodiment of the disclosure.

FIG. 7 is a schematic diagram of an assist driver 206' in FIG. 5 in accordance with the embodiment of the disclosure. As shown in FIG. 7, the difference between the assist driver 206' in FIG. 7 and the assist driver 206 in FIG. 4 is that the second control module 402' in FIG. 7 does not include the inverter 412 shown in FIG. 4, and the first input of the XOR gate 410 in the second control module 402' is directly coupled to the control signal 220, and the input of the delayer 411 in the second control module 402' is directly coupled to the control signal 220.

Referring to FIG. 5 to FIG. 7, when the control signal 210 is flipped, such as being changed from the logic high level to the logic low level, its differential signal 220 is flipped correspondingly, such as being changed from the logic low level to the logic high level. At this moment, the assist driver 700 in FIG. 7 and the driver S1' in FIG. 5 output a current prior to the driver S2'~S8', so that the current at the second output node DM gradually increases from a pre-determined current value, such as a quarter of the Ispec, to the value of the Ispec during a fixed time period. The fixed time period may be precisely controlled by adjusting the delay of the delayers X8~X14 in FIG. 5, i.e. by adjusting the delay time TD of each single delayer, wherein the delay time TD of each of the delayers X8~X14 may be adjusted. The pre-determined current value is determined by the sum of the rated current of the current source 413 included by the assist driver 700 and the rated current of the current source 301 included by the driver S1 in FIG. 5. For example, the rated current of a current source 413 included by the assist driver 700 is I1, such as one-eight of the Ispec, and the rated current of the current source 300 included by the driver S1 is I2, such as one-eight of the Ispec, and then the current at the first output node DP or the second output node DM is I1+I2, i.e. a quarter of the Ispec. Similar to the structure in FIG. 4, the assist driver 700 in FIG. 7 functions as a pre-emphasis and a de-emphasis to further speed up the output signal flipping at the first output node DP and the second output node DM, and to counteract an influence of load capacitance at the first output node DP or the second output node DM.

In addition to being applicable to USB, the driving device of the disclosed embodiment of the present invention can be further applied to a higher speed data interface, such as Low-voltage Differential Signaling (LVDS), Mobile Industry Processor Interface (MIPI), and Peripheral Component Interconnect-Express (PCI-E) . . . etc.

The ordinal in the specification and the claims of the present invention, such as "first", "second", "third", etc., has no sequential relationship, and is just for distinguishing between two different devices with the same name. In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. A driving device, comprising:
   an assist driver, receiving a control signal and being coupled to a first output node and a second output node to output a first current to the first output node and the second output node;
   a delay adjuster, receiving the control signal to generate a plurality of delay signals, wherein each of the delay signals has a different delay time corresponding to the control signal; and
   a plurality of drivers, wherein one of the drivers receives the control signal, other drivers correspondingly receive the plurality of delay signals, and the plurality of drivers are respectively coupled to the first output node and the second output node via a first output end and a second output end,
   when the control signal is a first logic level, the plurality of drivers respectively output a plurality of second current to the first output node via the first output in response to the delay time;
   when the control signal is a second logic level, the plurality of drivers respectively output the plurality of second current to the second output node via the second output in response to the delay time;
   wherein the assist driver comprises a first control module, and the first control module receives the control signal and detecting whether the control signal has flipped from the first logic level to the second logic level.

2. The driving device as claimed in claim 1,
   when the first control module detects that the control signal has flipped from the first logic level to the second logic level, the first control module outputs a first control signal with the second logic level; and
   when the first control module does not detect that the control signal has flipped from the first logic level to the second logic level, the first control module outputs the first control signal with the first logic level.

3. The driving device as claimed in claim 2, wherein the assist driver further comprises:
   an assist module, comprising a first current source, a first input end and a third output end,
   wherein the first input end receives the first control signal to output the first current from the third output end to the first output node when the first control signal is the second logic level,
   wherein the first current is output by the first current source.

4. The driving device as claimed in claim 1, wherein the assist driver further comprises:
   a second control module, receiving a second control signal and detecting whether the second control signal has flipped from the first logic level to the second logic level,
   wherein when the first control module detects that the second control signal has flipped from the first logic level to the second logic level, the second control module outputs the second control signal with the second logic level,
   when the second control module does not detect that the second control signal has flipped from the first logic level to the second logic level, the second control module outputs the second control signal with the first logic level, and
   the second control signal is an inverted signal or a differential signal of the control signal.

5. The driving device as claimed in claim 4, wherein the assist driver further comprises:
   an assist module, comprising a first current source, a second input end and a fourth output end,
   wherein the second input receives the second control signal, so that the assist module outputs the first current from the fourth output to the second output node when the second control signal is at the second logic level, and the first current is output by the first current source.

6. The driving device as claimed in claim 1, wherein each of the drivers comprises a first transistor, a second transistor, and a second current source;

a source of the first transistor is coupled to a source of the second transistor, and the second current source;

a drain of the first transistor is the first output end of the driving device, a drain of the second transistor is the second output end of the driving device, the first output end is coupled to the first output node, and the second output end is coupled to the second output node; and the first output end or the second output end outputs the second current based on the control signal, wherein the second current is output by the second current source.

7. The driving device as claimed in claim 6, wherein each of the drivers comprises:

an inverter, wherein an input end of the inverter is coupled to a gate of the second transistor, and an output end of the inverter is coupled to a gate of the first transistor; and the input end of the inverter is coupled to the control signal, and the control signal is a single-ended signal.

8. The driving device as claimed in claim 6, wherein a gate of the second transistor and a gate of the first transistor in each of the drivers are coupled to the control signal; and the control signal is a pair of differential signals, the gate of the second transistor is coupled to one of the differential signals, and the gate of the first transistor is coupled to the other of the differential signals.

9. The driving device as claimed in claim 6, wherein the rated current of the driving device is equal to a sum of currents, the currents are output by the second current source of each of the drivers.

10. The driving device as claimed in claim 1, wherein the delay adjuster comprises a plurality of delayers connected in series, and the delay time of each of the delayers is adjustable, so that time of a signal flipping at the first output node and the second output node be controlled.

11. The driving device as claimed in claim 10, wherein when a signal at the first output node starts to flip from a second level to a first level, an initial current at the first output node is equal to the sum of the second current of one of the drivers that receives the control signal and the first current; and a current at the first output node takes the delay time of each of the delayers as a time interval to take the second current of one of the drivers that receives the control signal as a current step to increase to a rated current of the driving device, wherein time required for the current at the first output node to increase to the rated current of the driving device is equal to a sum of the delay time of each of the delayers, wherein the assist driver stops to output the first current before the signal at the first output node starts to flip to the first logic level.

12. The driving device as claimed in claim 10, wherein when a signal of the first output node starts to flip from the first level to the second level, the initial current of the first output node is equal to the sum of the first current and the rated current of the driving device; and a current of the first output node takes the delay time of each of the delayers as a time interval to take the second current of one of the drivers that receives the control signal as a current step to decrease to the second current, wherein time required for the current at the first output node to decrease to the second current of one of the drivers that receives the control signal is equal to the sum of the delay time of each of the delayers;

wherein the assist driver stops to output the first current before the signal at the first output node starts to flip to the second logic level.

* * * * *